United States Patent [19]
Miyamoto

[11] 4,424,578
[45] Jan. 3, 1984

[54] BIPOLAR PROM

[75] Inventor: Junichi Miyamoto, Yokohama, Japan

[73] Assignee: Tokyo Shibaura Denki Kabushiki Daisha, Japan

[21] Appl. No.: 283,011

[22] Filed: Jul. 13, 1981

[30] Foreign Application Priority Data

Jul. 14, 1980 [JP] Japan .................................. 55-95844

[51] Int. Cl.$^3$ ...................... G11C 11/40; G11C 17/00
[52] U.S. Cl. ..................................... 365/104; 357/51; 357/59
[58] Field of Search .................. 365/104; 357/67 S, 2, 357/51, 59, 71

[56] References Cited

U.S. PATENT DOCUMENTS

| | | | |
|---|---|---|---|
| 3,570,114 | 3/1971 | Tsaug | 29/577 |
| 3,717,852 | 2/1973 | Abbas et al. | 357/71 |
| 3,980,505 | 9/1976 | Buckley | 357/2 |
| 4,146,902 | 3/1979 | Tanimoto et al. | 357/6 |

FOREIGN PATENT DOCUMENTS

| | | |
|---|---|---|
| 54-1430 | 1/1979 | Japan ................................ 357/67 S |
| 2103900 | 9/1971 | Fed. Rep. of Germany |
| 2300847 | 1/1975 | Fed. Rep. of Germany |

OTHER PUBLICATIONS

"Study on Cell Structure of P-ROM Using Polysilicon Resistor," Proceedings of 1979 Meeting, Semiconductor Material Department of the Japan Electronic Communication Institute, p. 130.

*Primary Examiner*—George G. Stellar
*Attorney, Agent, or Firm*—Finnegan, Henderson, Farabow, Garrett and Dunner

[57] ABSTRACT

A semiconductor memory device has memory cells, each including an emitter region formed in a base region as a bit line, a barrier layer formed in a hole formed in the oxide layer to be in contact the emitter region, a high resistance layer formed thereon, and a metal wiring layer as a word line in contact with the high resistance layer. By applying a voltage between the bit line and the word line, the metal wiring layer melts the part where both these lines cross, punches through the high resistance layer, and reaches the barrier layer, thus short-circuiting both these lines and accomplishing writing.

11 Claims, 10 Drawing Figures

BIPOLAR PROM

BACKGROUND OF THE INVENTION

The present invention relates to a semiconductor device and, more particularly, to a programmable read-only memory (hereinafter referred to as a PROM) having memory cells of bipolar transistors in which data may be freely written.

Although a bipolar PROM is defective as compared with a MOS PROM in that data may not be rewritten once written therein, the access time of the bipolar PROM is several times faster than that obtainable with the MOS PROM, the reliability is higher, and the bipolar PROM is relatively inexpensive. Therefore, a bipolar PROM is relatively inexpensive. Therefore, a bipolar PROM is being used for stock, code conversion or the like of microprograms for a computer.

Writing systems in bipolar PROM may be roughly classified into the fuse type and the avalanche-induced migration type.

A PROM of the fuse type has a structure such that a fuse is connected to the emitter of a bipolar transistor, the base thereof is connected to a bit line, and the fuse is connected to a word line. The fuse may be nicrome, polycrystalline silicon, titanium-tungsten, or the like. In a PROM of the fuse type, writing may be accomplished by electrically disconnecting the fuse. FIG. 1 shows the structure of a basic memory cell of the PROM of such fuse type. A p-type base region 2 constituting a bit line is formed in an n-type epitaxial layer 1 within a semiconductor substrate. An n+-type emitter region 3 is formed within the p-type base region 2. A fuse 5 connected to the emitter region 3 through a contact hole is formed on an insulation film 4 on the semiconductor substrate. This fuse 5 is connected to a word line wiring 6, and both are protected by a passivation film 7. A PROM of such a structure has a characteristic in that the writing voltage may be varied by the substrate constituting the fuse. A PROM of writing voltage within a range of 10 to 25 V is already on the market. However, since the fuse is transversely formed, a considerably large area is required, resulting in a disadvantage in that integration density may not be improved. Furthermore, a passivation film must be selected which may not be adversely affected by heat generated upon disconnection of the fuse or by mutual action of the fuse and the passivation film upon disconnection thereof. The PROM of this type further suffers from a structurally inherent and unavoidable defect known as grow-back according to which the disconnected fuse is reconnected.

On the other hand, a PROM of the avalanche-induced migration type has a structure as shown in FIG. 2. A p-type base region 12 is formed in an n-type epitaxial layer 11 of the semiconductor substrate, and an emitter region 13 of shallow junction is formed in the base region 12. An insulation film 14 is formed on the semiconductor substrate. An aluminum electrode 15 connected to the emitter region 13 through a contact hole is formed on the insulation film 14. That is, the memory cell has two opposing diodes. With a PROM of this structure, writing is performed by applying a breakdown voltage in the reverse direction between the emitter and the base to break the junction therebetween. Since the memory cell is of vertical structure according to this system, improvements in integration may be expected. Since the breakdown occurs within the semiconductor substrate, writing may be performed in a relatively stable manner, and the grow-back frequently seen in a PROM of fuse type rarely occurs. Furthermore, since the impedance of the memory cell is low after writing has been accomplished, the operating speed may be high. However, since the breakdown voltage to be applied between the emitter and the base of the transistor is substantially constant even when the concentration or diffusion depth of the impurity is varied, the writing voltage necessarily becomes high and it is difficult to change it by much. As a result, in designing the PROM, the epitaxial layer must be made thick to withstand the high writing voltage. This results in an increase in the collector-base capacitance, a reduction in the access time and so on. Further, since voltage resistance is required between the elements to a certain extent, a special element-separating technique must be adopted. In addition, the distance between the elements (width of the element-separating region) must be made great. This results in reductions in integration and operating speed.

SUMMARY OF THE INVENTION

It is an object of the present invention to provide a semiconductor memory device which eliminates the defects of memory devices of fuse type and avalanche-induced migration type.

It is another object of the present invention to provide a semiconductor memory device which is capable of achieving improvements in integration, which does not cause grow-back, and with which the writing voltage may be varied.

In order to achieve these and other objects, there is provided according to the present invention a semiconductor memory device having memory cells of bipolar transistors characterized by including, in one of said memory cells, a barrier layer formed in a hole formed in an oxide layer to be in contact with an emitter region, a high resistance layer formed on said barrier layer, and a word line wiring layer connected to said high resistance layer.

With a semiconductor memory device of the present invention, high reliability may be achieved since grow-back, as may frequently occur with a memory device of fuse type, does not occur. The semiconductor memory device of the present invention is further advantageous in that the writing voltage may be set at a desired level in a simple manner by changing the material of the high resistance layer or the thickness thereof. Integration may also be improved.

DETAILED DESCRIPTION OF THE PREFERRED EMBODIMENTS

An embodiment of the present invention as applied to a PROM will be described in detail which reference to the fabricating method therefor.

Figure 1:
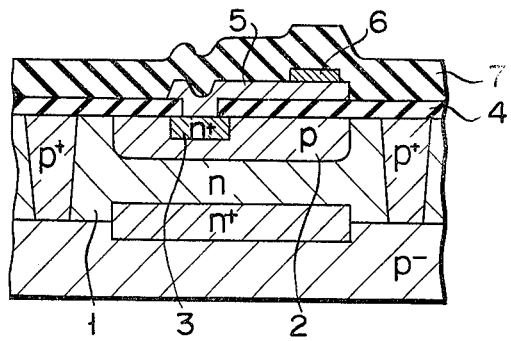
FIG. 1 is a sectional view of a conventional memory cell of a transistor of fuse type.
Figure 2:
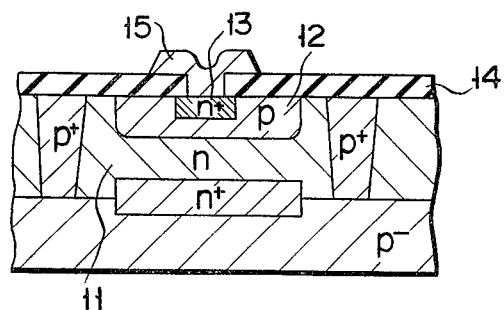
FIG. 2 is a sectional view of a conventional memory cell of a transistor of avalanche-induced migration type.
Figure 3:
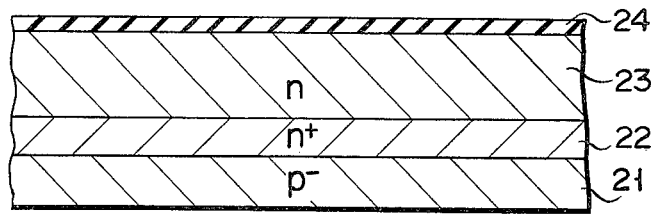
FIGS. 3 to 8 are sectional views showing the fabrication process of a memory cell according to one embodiment of the present invention.
Figure 4:
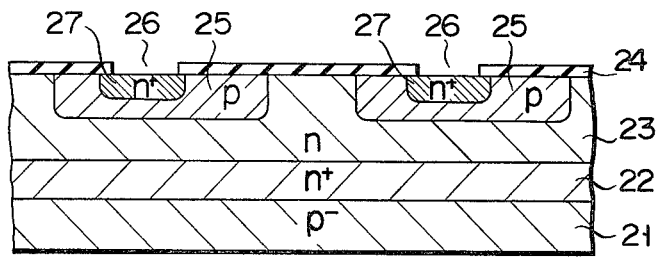

First, as shown in FIG. 3, an $n^+$-type burried layer 22 is formed in a $p^-$-type silicon substrate 21. After growing an n-type epitaxial layer 23 as a collector region on the substrate 21, thermal oxidation is performed to grow a silicon oxide film 24. Subsequently, boron is selectively ion-implanted in the n-type epitaxial layer 23. A plurality of p-type base regions 25 as bit lines extending in the column direction are formed by annealing. Parts of the silicon oxide film 24 at which emitter regions are to be formed are selectively etched away by photoetching to form holes 26 as emitter diffusion window. Thereafter, as shown in FIG. 4, arsenic is thermally diffused into the base regions 25 through the holes 26 to form a plurality of $n^+$-type emitter regions 27.

Figure 5:
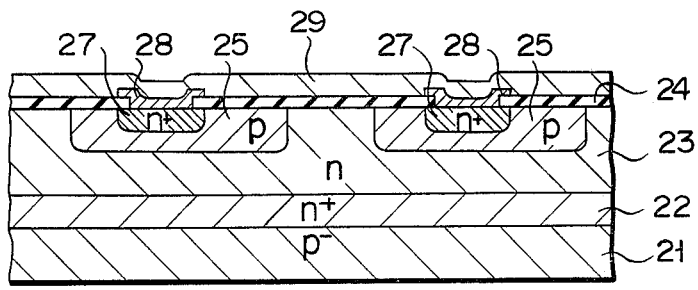

Next, as shown in FIG. 5, a molybdenum layer is formed on the entire surface of the structure which is thereafter patterned to form molybdenum patterns 28 (barrier layers) on the holes 26. An undoped polycrystalline silicon layer 29 is formed by the chemical vapor deposition (CVD) method as a high resistance layer on the entire surface of the structure.

Figure 6:
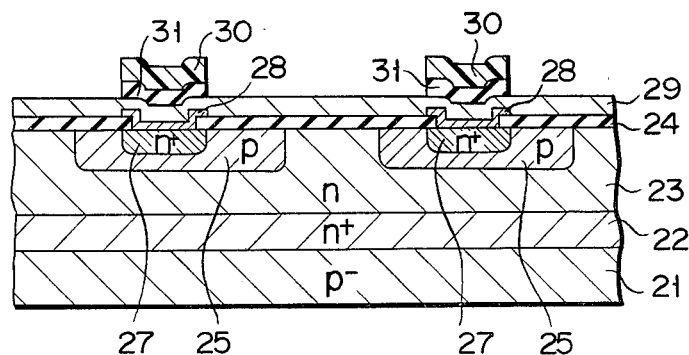
Figure 7:
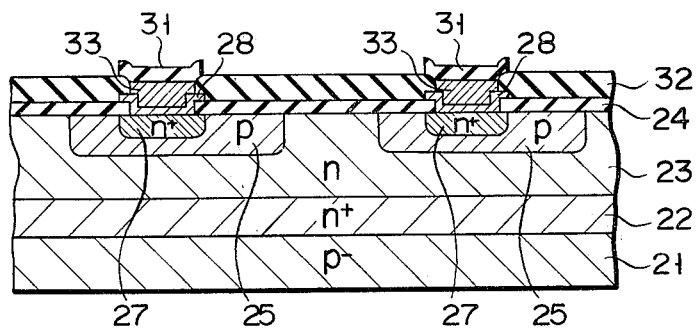

Then, a silicon nitride film as an antioxidant mask is deposited on the polycrystalline silicon layer 29. After forming resist films 30 on the parts of the silicon nitride film above the emitter regions 27 by photoetching, as shown in FIG. 6, the silicon nitride film is selectively etched by a fluorine-type plasma using the resist films 30 as a mask to form silicon nitride film patterns 31 on the parts of the polycrystalline layer 29 above the emitter regions 27. After removing the resist films 30, the polycrystalline silicon layer 29 is selectively oxidized in a high temperature wet atmosphere using the silicon nitride film patterns 31 as an antioxidant mask. Upon this step, as shown in FIG. 7, the polycrystalline silicon layer 29 exposed through the silicon nitride film patterns 31 is converted into a thick silicon oxide film 32, thus forming, within the holes 26 of the emitter regions 27, polycrystalline silicon patterns 33 as high resistance layers electrically insulated from each other by the silicon oxide layers 32.

Figure 8:
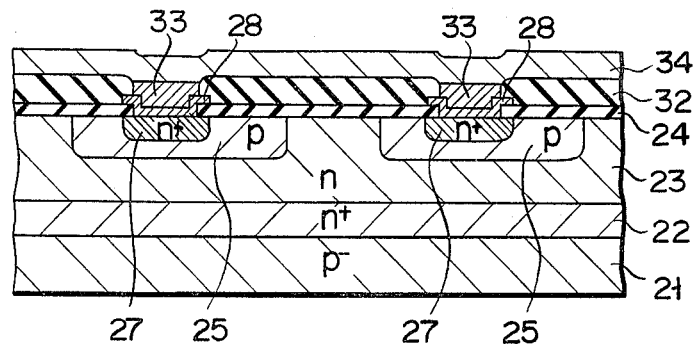
Figure 9:
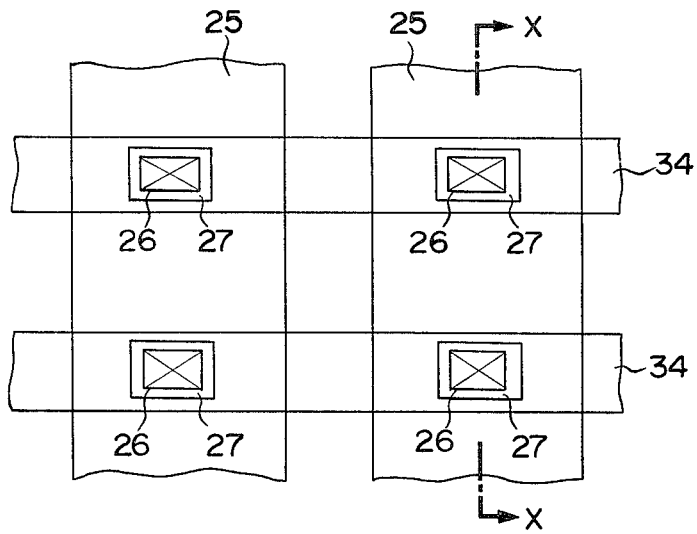
FIG. 9 is a front view of the memory cell in FIG. 8 according to the present invention.
Figure 10:
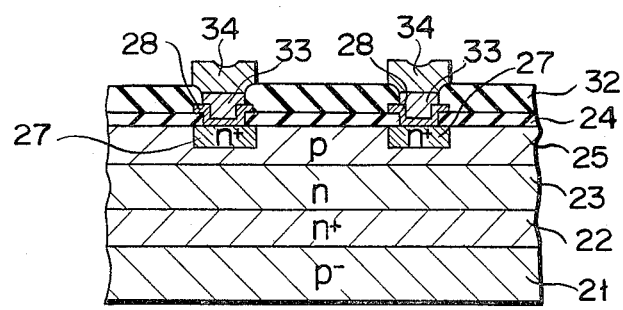
FIG. 10 is a sectional view along the line X—X of FIG. 9.

The silicon nitride film patterns 31 are etched away by a fluorine-type plasma. Thereafter, as shown in FIG. 8, aluminum is vacuum-evaporated on the entire surface of the structure. The aluminum deposited layer is patterned by photoetching to form a plurality of aluminum wirings 34 (conductive layers) as word lines partly located on the polycrystalline silicon patterns 33 and extending in the row direction, thereby completing the manufacture of a PROM having a plurality of memory cell transistors in which data may be written.

In the fabricating method as described above, the formation of the high resistance layers 33 is performed by the selective oxidation of the polycrystalline silicon layer 29 using the silicon nitride film patterns 31 as a mask. Therefore, the high resistance layers 33 of narrow polycrystalline silicon patterns which do not extend in the transverse direction and which are electrically separated from each other by the silicon oxide film 32 may be formed in the emitter holes 26. For this reason, leakage current may be suppressed, and the impedance during non-writing intervals may be made high, so that reliability in reading out may be improved. Since the element surface is flat, disconnection of the aluminum wirings 34 may be prevented.

The method for forming the high resistance layers is not particularly limited to that described above. The high resistance layers may thus be formed by, for example, forming a silicon oxide layer in place of the polycrystalline silicon layer 29 in FIG. 5, selectively etching the silicon oxide layer to expose the molybdenum barrier layers, forming a polycrystalline silicon layer on the entire surface of the structure and selectively removing the polycrystalline silicon layer, leaving it only at parts thereof above the molybdenum barrier layers.

The material of the barrier layers is not limited to molybdenum. It is, however, preferable to use high melting-point metals such as tungsten, tantulum and platinum, or metal silicides such as molybdenum silicide and tungsten silicide. Instead of polycrystalline silicon, the high resistance layers may be made of amorphous silicon, electrically conductive plastics or the like. The wiring material is not limited to aluminum but may be aluminum alloys such as aluminum-silicon, aluminum-copper, and aluminum-silicon-copper.

The memory cell of the PROM according to the present invention has a structure, as shown in FIG. 8, according to which a plurality of p-type base regions 25 extending in the column direction are formed in the n-type epitaxial layer 23 as the collector region of the semiconductor substrate; the $n^+$-type emitter regions 27 are formed within these base regions 25; the high resistance layers 33 are formed in the holes 26 of these emitter regions 27 through the molybdenum barrier layers 28; and the aluminum wirings 34 are formed partially on these polycrystalline silicon high resistance layers 33 and extending in the row direction.

With memory cells of such a structure, when a voltage is applied across the base region 25 as the bit line and the aluminum wiring 34 as the word line, the part of the aluminum wiring layer crossing with the bit line melts, punches through the high resistance layer 33 of polycrystalline silicon, and contacts the molybdenum barrier layer to be connected with the emitter region 27, so that writing may be performed. For reading out data from the PROM of such a structure, the potential of the base region 25 as the bit line is detected while maintaining the aluminum wiring layer 34 as the word line at a low voltage. When the detected voltage is a low voltage due to the low voltage of the word line, it is judged that data has been written in the PROM. When the detected voltage remains high, it is judged that data has not been written in the PROM. Thus, the judgement of "0" or "1" is made according to the impedance difference of the memory cell. These operations may be generally performed by peripheral circuits.

Since the barrier layer is present below the high resistance layer and prevents ingress into the emitter region 27 of the wiring material such as aluminum which has punched through the high resistance layer, the reliability of the memory cells may be significantly improved. Furthermore, the presence of the barrier layer allows a wider range of selection for the material and the thickness of the high resistance layer. Thus, by suitably selecting the material and thickness of this high resistance layer, the writing voltage may be arbitrarily set. Since the memory cell of this PROM is at a high impedance as in the case of an avalanche-induced migration system before data is written and is caused to be short-circuited upon writing data therein, the problem of grow-back is solved and the reading out may be advantageously performed at a low impedance. In addition to this, since the barrier layer and the high resistance layer are formed vertically on the emitter region, integration may be improved.

What is claimed is:

1. A semiconductor memory device having a plurality of bipolar transistors each having an emitter region and a base region, said emitter region located in said base region, said base region forming a bit line, and at least one of said memory cells including:
   a. an oxide layer covering said emitter region;
   b. a contact hole in said oxide layer extending to said emitter region;
   c. a barrier layer in said contact hole contacting said emitter region;
   d. a high resistance layer formed on said barrier layer;
   e. a metal wiring layer forming a word line and contacting said high resistance layer, wherein said metal wiring layer melts to contact said barrier layer through said high resistance layer, thereby short-circuiting said bit line and word line, when a voltage for writing is applied across said bit line and said word line.

2. A semiconductor memory device according to claim 1 wherein said barrier layer is made of a member selected from the group consisting of high melting-point metals and metal silicides.

3. A semiconductor memory device according to claim 1 wherein said barrier layer is made of a member selected from the group consisting of molybdenum, tungsten, tantulum, and platinum.

4. A semiconductor memory device according to claim 1 wherein said barrier layer is made of a member selected from the group consisting of molybdenumsilicide and tungstensilicide.

5. A semiconductor memory device according to claim 1 wherein said high resistance layer is made of a member selected from the group consisting of polycrystalline silicon, amorphous silicon, and electrically conductive plastics.

6. A semiconductor memory device comprising:
   a. a plurality of memory cells arranged in row and column directions, each memory cell including:
      (i) a substrate;
      (ii) a first semiconductor region of a first conductivity type formed on said substrate;
      (iii) a second semiconductor region of a second conductivity type opposite to said first conductivity type and formed in and coplanar with said first semiconductor region;
      (iv) an insulation layer covering said first and second semiconductor regions;
      (v) a hole in said insulation region over said second semiconductor region;
      (vi) a barrier layer contacting said second semiconductor region through said hole formed in said insulation layer; and
      (vii) a high resistance layer formed on said barrier layer and made of material selected from the group consisting of polycrystalline silicon and amorphous silicon;
   b. bit lines each connecting said second semiconductor regions of said memory cells disposed in the column direction; and
   c. word lines comprising metallic layers each connecting said high resistance layers of said memory cells disposed in the row direction, wherein at least one of said metallic layers crossing with a bit line melts to contact said barrier layer through said high resistance layer, thereby short-circuiting said bit line and word line, when a voltage for writing is applied across said bit line and said word line.

7. A device according to claim 6 wherein said first semiconductor region is formed in a semiconductor substrate of said second conductivity type.

8. A device according to claim 7 wherein said first and second semiconductor regions and said semiconductor substrate constitute a bipolar transistor.

9. A device according to claim 8 wherein said first semiconductor regions form said bit lines.

10. A device according to claim 9 wherein said barrier layer is made of a material selected from the group consisting of molybdenum, tungsten, tantulum, and platinum.

11. A device according to claim 10 wherein said barrier layer is made of a material selected from the group consisting of molybdenumsilicide and tungstensilicide.

* * * * *